United States Patent
Deppe

(10) Patent No.: US 7,038,461 B1
(45) Date of Patent: May 2, 2006

(54) BLEED AIR VALVE TEST SET

(75) Inventor: Louis W. Deppe, Middleburg, FL (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 3 days.

(21) Appl. No.: 10/956,587

(22) Filed: Sep. 29, 2004

(51) Int. Cl.
*G01R 31/14* (2006.01)

(52) U.S. Cl. ........................................ 324/511

(58) Field of Classification Search .............. 324/509, 324/510, 511; 361/42
See application file for complete search history.

(56) References Cited

U.S. PATENT DOCUMENTS 4,706,908 A * 11/1987 Huffman et al. ......... 244/118.5
4,787,212 A * 11/1988 Hessey ...................... 62/188
6,788,504 B1 * 9/2004 Vanderkolk ................ 361/42

* cited by examiner

*Primary Examiner*—Anjan Deb
*Assistant Examiner*—John Teresinski
(74) *Attorney, Agent, or Firm*—Mark O. Glut

(57) ABSTRACT

A test set that includes a circuit breaker, at least two test points, a single pole switch, a double pole switch, and a set of test lights. The at least two test points are for reading amperage when testing a bleed air shutoff valve in aircraft. The at least two test points electronically communicate with the circuit breaker. The single pole switch electronically communicates with the circuit breaker and the at least two test points. The double pole switch is able to open and close and shut off the bleed air shutoff valve electronically. The double pole switch electronically communicates with the single pole switch and the at least two test points. One of the lights is able to inform whether power is being applied to the test set, another light is able to inform whether the double pole switch is open.

7 Claims, 2 Drawing Sheets

BLEED AIR VALVE TEST SET

STATEMENT OF GOVERNMENT INTEREST

The invention described herein may be manufactured and used by or for the Government of the United States of America for governmental purposes without payment of any royalties thereon or therefor.

BACKGROUND

The present invention relates to a test set. More specifically, but without limitation, the present invention relates to a test set used on a bleed air shutoff valve in an aircraft.

A bleed air shutoff valve or an engine nacelle and fuselage bleed air shutoff valve is typically, but without limitation, an air valve that permits passage of anti-icing hot air in one direction (typically passing to the cross ship manifold) and allows starting airflow to pass in the opposite direction (typically passing to the engine). In various aircrafts, the bleed air shutoff valve may be operated in different fashion. For instance, but without limitation, in a P-3 aircraft, the bleed air shutoff valve is motor operated and is operated by a reversible electric actuator.

In a typical aircraft there are several bleed air shutoff valves. For instance, in a P-3 there are usually seven bleed air shutoff valves. If one is removed or is not operational this may render the entire aircraft inoperable. Maintaining the bleed air shutoff valves and ensuring their proper operation can save substantial costs, minimize aircraft down time, and possibly save lives. Currently, the United States Navy utilizes test procedures outlined in NAVAIR manual 01-75PAA-2-50, W/P 019-00. Bleed air shutoff valves are passing test procedures outlined in the manual, but failing at an operational level. In addition, the procedures outlined in this manual present a safety concern for the user, specifically the risk for a possible electric shock. Thus there exists a need for a test set and procedure that is safe and adequately tests bleed air shutoff valves.

SUMMARY

The present invention is directed to a test set that includes a circuit breaker, at least two test points, a single pole switch, a double pole switch, and a set of test lights. The at least two test points are for reading amperage when testing a bleed air shutoff valve in an aircraft. The at least two test points electronically communicate with the circuit breaker. The single pole switch electronically communicates with the circuit breaker and the at least two test points. The double pole switch is able to open and close and shut off the bleed air shutoff valve electronically. The double pole switch electronically communicates with the single pole switch and the at least two test points. One of the lights is able to inform the user whether power is being applied to the test set, another light is able to inform the user whether the double pole switch is open.

It is a feature of the invention to provide a test set that is reliable and inexpensive.

It is a feature of the invention to provide a test set that increases usage life of bleed air shutoff valves by determining which components need to be replaced or repaired.

It is a feature of the invention to provide a test set that provides no electrical hazard to the user.

BRIEF DESCRIPTION OF THE DRAWINGS

These and other features, aspect and advantages of the present invention will become better understood with reference to the following description and appended claims, and accompanying drawings wherein:

DETAILED DESCRIPTION OF THE INVENTION

Figure 1:
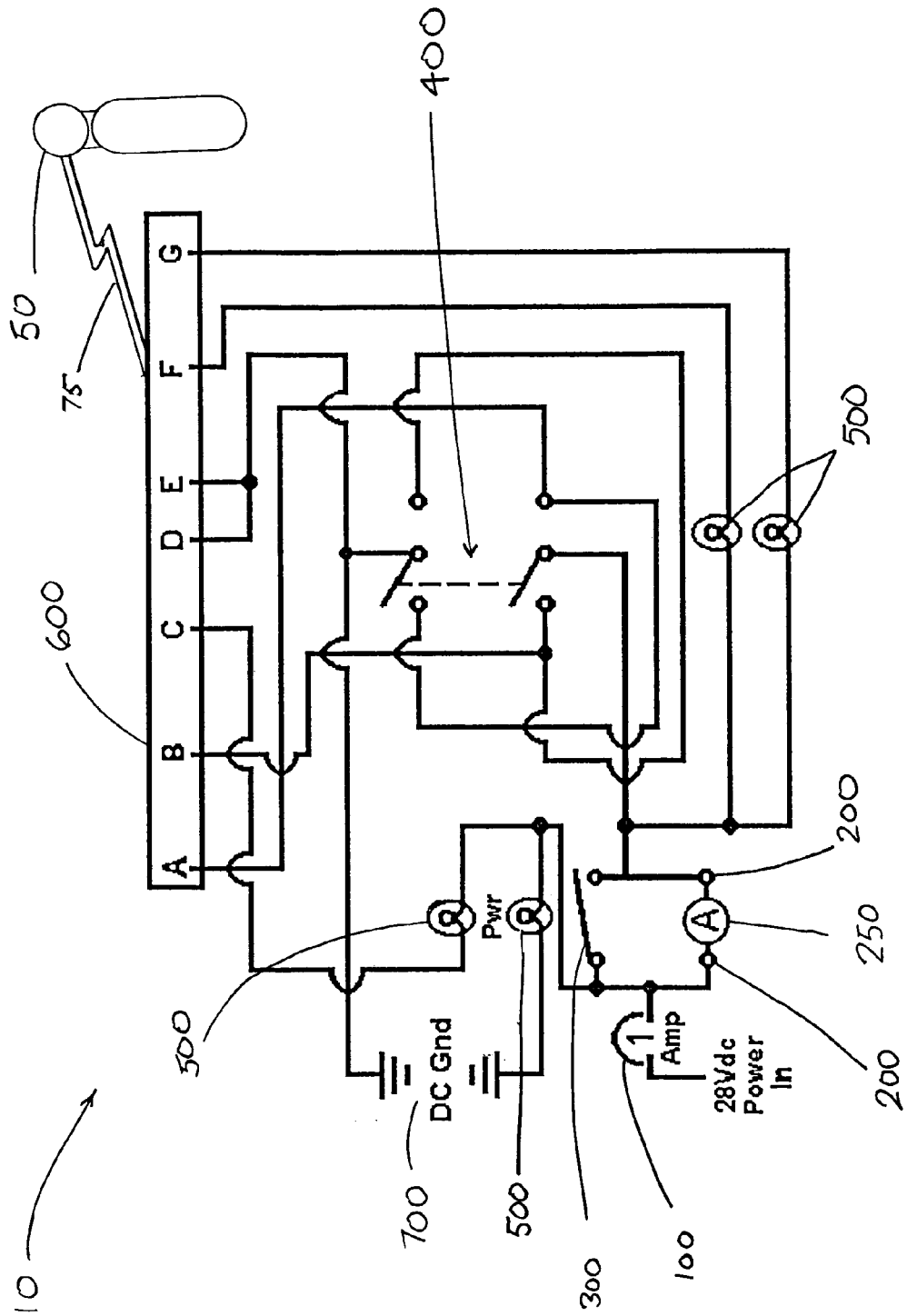
FIG. 1 is an electronic schematic of an embodiment of the test set.
Figure 2:
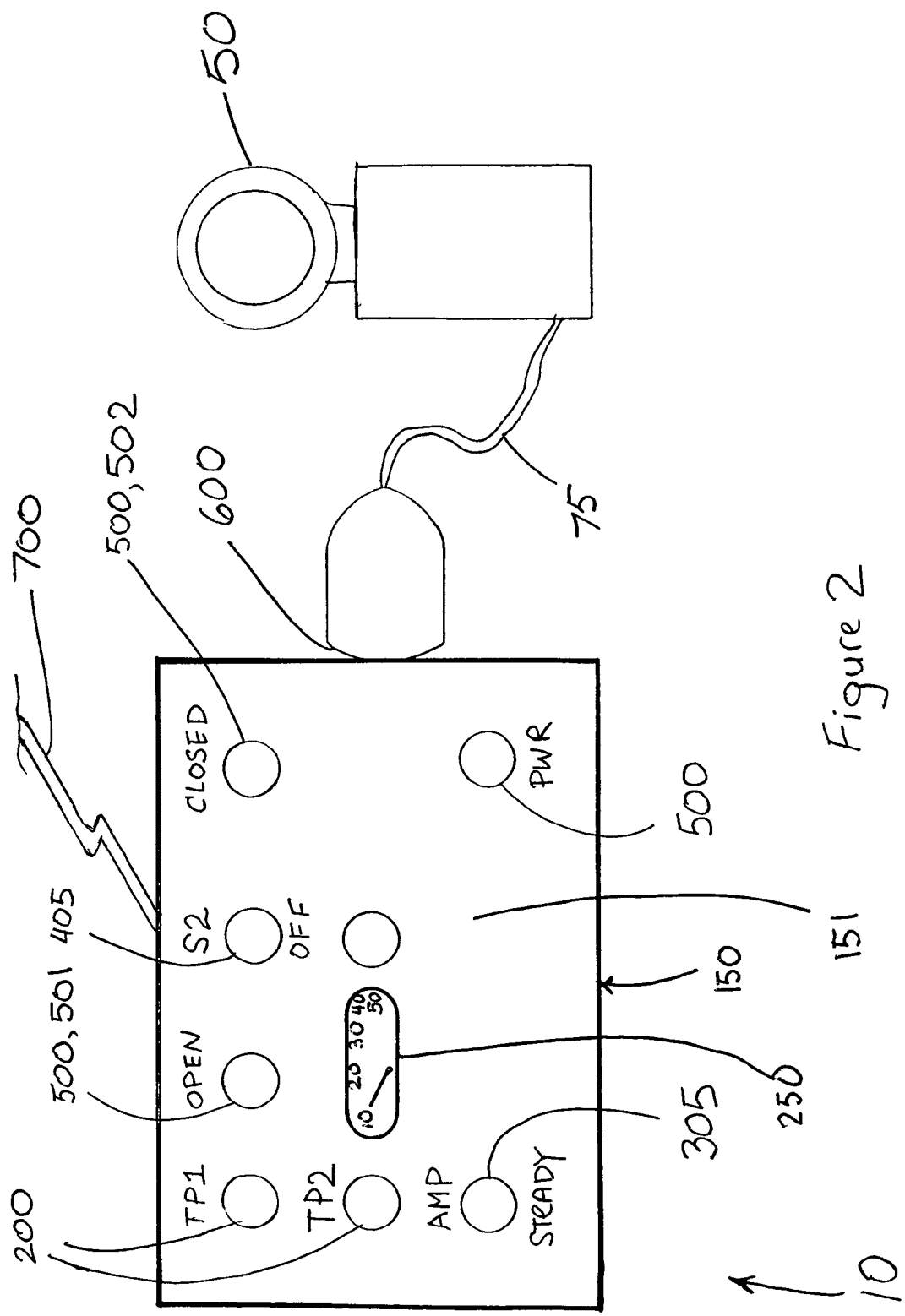
FIG. 2 is a top view of an embodiment of the test set in use.

The preferred embodiments of the present invention are illustrated by way of example in FIGS. 1 and 2. As seen in FIG. 1, the test set 10 includes a circuit breaker 100, at least two test points 200, a single pole switch 300, a double pole switch 400, and a set of test lights 500. The at least two test points 200 are for reading amperage when testing a bleed air shutoff valve 50 in an aircraft. The at least two test points 200 electronically communicate with the circuit breaker 100. The single pole switch 300 electronically communicates with the circuit breaker 100 and the at least two test points 200. The double pole switch 400 is able to open, close and shut off the bleed air shutoff valve 50 electronically. The double pole switch 400 electronically communicates with the single pole switch 300 and the at least two test points 200. At least one of the test lights 500 is able to inform a user whether power is applied to the test set 10, while another test light 500 is able to inform a user whether the double pole switch 400 is open.

In the discussion of the present invention, the system will be discussed in an aircraft environment, specifically a military aircraft engine environment; however, the system can also be utilized for any type of system that utilizes a valve.

A circuit breaker 100 may be defined, but without limitation, as an automatic device which, under abnormal conditions, will open a current carrying circuit without damaging itself, or it can be defined as, without limitation, as a device for interrupting a circuit under normal or abnormal conditions by means of separable contacts. The circuit breaker 100 may be a one (1) Amp circuit breaker and may remove power from the test set 10 in case of electrical or mechanical problems with the bleed air shutoff valve 50.

The preferred single pole switch 300 is a single pole/single throw switch 300. A single pole/single throw switch 300 can be defined, but without limitation, as a two terminal switch which either opens or closes one circuit.

The preferred double pole switch 400 is a double pole/double throw switch 400. A double pole/double throw switch 400 can be defined, but without limitation, as a switch that has six terminals and is used to connect one pair of terminals to either of the other two pairs.

The test set 10 may further include a connector 600 that electronically connects the test set 10 to the bleed air shutoff valve 50. The test set 10 may also include an enclosure 150. The circuit breaker 100, the at least two test points 200, the single pole switch 300, the double pole switch 40 may be disposed within the enclosure 150. The set of test lights 500 may be disposed on the outside portion 151 of the enclosure 150 such that the test lights 500 may be seen without opening the enclosure 150. The single pole switch 300 may have a single pole switch button 305 or flip switch, which allows a user to open or close the single pole switch 300. The double pole switch 400 may have a double pole switch button 405 or flip switch, which allows a user to open or close the double pole switch 400. The single pole switch button 305 or flip switch and the double pole switch button 405 or flip switch may be located on the outside portion 151 of the enclosure 150 so that the switch or button may be manipulated without opening the enclosure 150.

The test set 10 may also include an external meter 250, which allows reading of amperage when testing the bleed air shutoff valve 50. The external meter 250 may be disposed on the outside portion 151 of the enclosure 150.

The test set 10 may also include a power ground 700. A power ground 700 may be defined, but without limitation, as the ground between units which is part of a circuit for the main source of power to, or from, these units.

To test the bleed air shutoff valve 50, the test set 10 is connected to the bleed air shutoff valve 50 via the connector 600 using an interface test cable 75. The preferred set up is shown in FIG. 2. Power is applied to the test set 10, which in turn applies power to the bleed air shutoff valve 50. Multimeter leads are attached to the bleed air shutoff valve 50. The single pole switch button 305 or flip switch is set to the Amp position, which closes the single pole switch 300. The test set 10 may have a "closed" light 502 and an "open" light 501 (both being test lights 500). The lights show whether the double pole switch 400 is open or closed. The "closed" light 502 or "open" light 501 should illuminate and the external meter 250 should indicate 40+/−5 milliamps (ma). If the "closed" light 502 or the "open" light 501 do not illuminate and/or a reading within the acceptable range of milliamps is not shown on the external meter 250, this is an indication the motor of the bleed air shutoff valve 50 or the external meter 250 is malfunctioning. Replace the external meter 250 and test the bleed air shutoff valve 50 again. If the outcome is the same then the motor of the bleed air shutoff valve 50 needs to be replaced.

When introducing elements of the present invention or the preferred embodiment(s) thereof, the articles "a," "an," "the," and "said" are intended to mean there are one or more of the elements. The terms "comprising," "including," and "having" are intended to be inclusive and mean that there may be additional elements other than the listed elements.

Although the present invention has been described in considerable detail with reference to certain preferred versions thereof, other versions are possible. Therefore, the spirit and scope of the appended claims should not be limited to the description of the preferred versions contained herein.

What is claimed is:

1. A test set for testing bleed air shutoff valves in aircraft, the test set, comprising:
   a circuit breaker;
   at least two test points, the at least two test points for reading amperage when testing a bleed air shutoff valve in an aircraft; the at least two test points electronically communicating with the circuit breaker;
   a single pole switch, the single pole switch electronically communicating with the circuit breaker and the at least two test points;
   a double pole switch, the double pole switch being able to open, close and shut off the bleed air shutoff valve electronically, the double pole switch electronically communicating with the single pole switch and the at least two test points; and,
   a set of test lights, one of the lights being able to inform whether power is being applied to the test set, another light being able to inform whether the double pole switch is open.

2. The test set of claim 1, wherein the test set further comprises an enclosure, the circuit breaker, the at least two test points, the single pole switch, the double pole switch disposed within the enclosure.

3. The test set of claim 1, wherein the single pole switch is a single pole, single throw switch.

4. The test set of claim 1, wherein the double pole switch is a double pole, double throw switch.

5. The test set of claim 1, wherein the test set further comprises an external meter, the external meter allows reading of amperage when testing the bleed air shutoff valve.

6. The test set of claim 1, wherein the test set further comprises a connector, the connector electronically connects the test set to the bleed air shutoff valve.

7. The test set of claim 1, wherein the test set further comprises a power ground, the power ground for providing power to the test set.

* * * * *